United States Patent
Dubhashi et al.

(10) Patent No.: US 6,522,178 B2
(45) Date of Patent: Feb. 18, 2003

(54) CONTROLLING HIGH SIDE DEVICES WITHOUT USING LEVEL SHIFT SWITCHES

(75) Inventors: Ajit Dubhashi, Redondo Beach, CA (US); David C. Tam, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/840,050

(22) Filed: Apr. 24, 2001

(65) Prior Publication Data

US 2001/0024134 A1 Sep. 27, 2001

Related U.S. Application Data

(60) Provisional application No. 60/201,670, filed on May 3, 2000, provisional application No. 60/130,479, filed on Apr. 22, 1999, and provisional application No. 60/145,800, filed on Jul. 27, 1999.

(51) Int. Cl.⁷ .................................................. H03K 3/00
(52) U.S. Cl. ......................................... 327/108; 326/83
(58) Field of Search ........................ 327/108–112, 434, 327/436, 437; 326/82, 83

(56) References Cited

U.S. PATENT DOCUMENTS

| 4,733,342 A | * | 3/1988 | Mueller et al. | 327/170 |
| 6,232,803 B1 | * | 5/2001 | Nguyen | 327/63 |

* cited by examiner

*Primary Examiner*—Kenneth B. Wells
(74) *Attorney, Agent, or Firm*—Ostrolenk, Faber, Gerb & Soffen, LLP

(57) ABSTRACT

Circuits for communicating between high side devices and low side controllers without using level shifting switches are provided. A low voltage controller with time coding circuitry generates an output, such as a voltage, a current, or a digital signal for controlling a high side switch. A driver is connected to the high side switch and receives the signal from the controller, decodes the signal, and generates on and off time pulses for controlling the high side switch. The communication between the controller and the driver does not require any level shifting circuitry.

13 Claims, 3 Drawing Sheets

CONTROLLING HIGH SIDE DEVICES WITHOUT USING LEVEL SHIFT SWITCHES

This application claims the benefit of U.S. Provisional Application Serial No. 60/201,670, filed May 3, 2000, U.S. Provisional Application Serial No. 60/130,479, filed Apr. 22, 1999, and U.S. Provisional Application Serial No. 60/145,800, filed Jul. 27, 1999, the disclosures of which are incorporated herein by reference.

BACKGROUND OF THE INVENTION

1. Field of the Invention

The present invention relates to methods of communicating between a high side device driver and a low side controller without using a level shift circuit.

2. Brief Description of the Prior Art

Most circuits in power processing applications use a "high side device" that needs to be controlled (i.e., turned on or off at predetermined times) to process the power. These devices (IGBTs, FETs, bipolars and other devices) utilize a "driver IC" that raises its gate above its source to turn it on. As during the turn on process, the source/emitter also rises substantially above the -ve rail of the DC bus (to which the main controller is typically referenced). This causes the driver to "float up" with the device source voltage. Consequently, high voltage ICs (HVICs) with internal level shifting switches typically are used to communicate the "on/off" signals to the driver of the gate. A typical prior art circuit is illustrated in FIG. 1.

Referring to FIG. 1, a controller 2 communicates with a power switching circuit 4 by way of HVIC 6. The switching circuit includes high side switch 8 and low side switch 10. A high side driver 12 and a low side driver 14 of the HVIC 6 are associated with the high and low side switches 8, 10, respectively. The two switches are connected in series between a high voltage rail and ground. The high voltage rail typically carries hundreds of volts. In contrast the controller 2 typically operates in the 5 volt range. Consequently, in order for the controller 2 to communicate with high side switch 8, a level shift circuit 16 is incorporated in HVIC 6 to communicate the low voltage signal from controller 2 to the high side driver 12. The circuits operate to generate a signal at output 18. Typically, the controller alternates opening and closing the two switches to generate a high voltage square wave, for example.

In some cases, the high side driver also performs "fault protection." This involves sensing a parameter in the high side switching device, such as current or voltage, for example, and turning off the device to protect it from failure in the event that the parameter exceeds a certain value. The decision is then communicated to the controller by means of a level shift down device. An example of such a prior art circuit is shown in FIG. 2.

Referring to FIG. 2, a controller 20 communicates with a power switching circuit 22 by way of HVIC 24. The switching circuit includes high side switch 26 and low side switch 28. A high side driver 30 and a low side driver 32 of the HVIC 24 are associated with the high and low side switches 30, 32, respectively. The controller 20 communicates with high side switch 26 by way of a level shift up circuit 34, similar to the circuit shown in FIG. 1. Fault protection information generated by protection circuitry in driver 30 is communicated back to controller 20 by way of a level shift down circuit 36.

Accordingly, the need exists for a technique for communicating between a high side driver circuit and a low voltage controller without requiring level shifting circuitry.

SUMMARY OF THE INVENTION

The present invention provides analog and digital methods of achieving communication with the high side driver without requiring an HVIC with an internal level shift circuit.

A preferred circuit according to the present invention includes a low voltage controller with time coding circuitry generating an output, such as a voltage, a current, or a digital signal. A driver includes circuitry for decoding the output and controlling a high voltage switch. Circuitry for communicating between the controller and the driver is provided which does not require level shift circuitry. The driver decodes the signals received from the controller to generate on and off time pulses for controlling the switch.

DETAILED DESCRIPTION OF THE PREFERRED EMBODIMENTS

Figure 1:
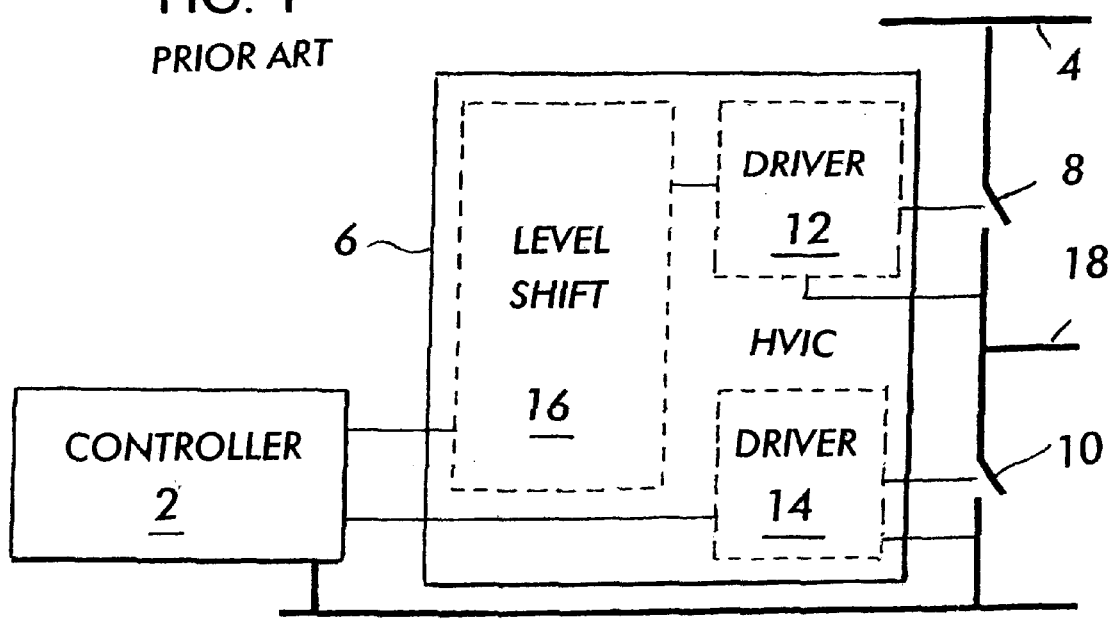
FIG. 1 is a block diagram illustrating a prior art circuit for communicating between a controller and a high side driver using level shift circuitry.
Figure 2:
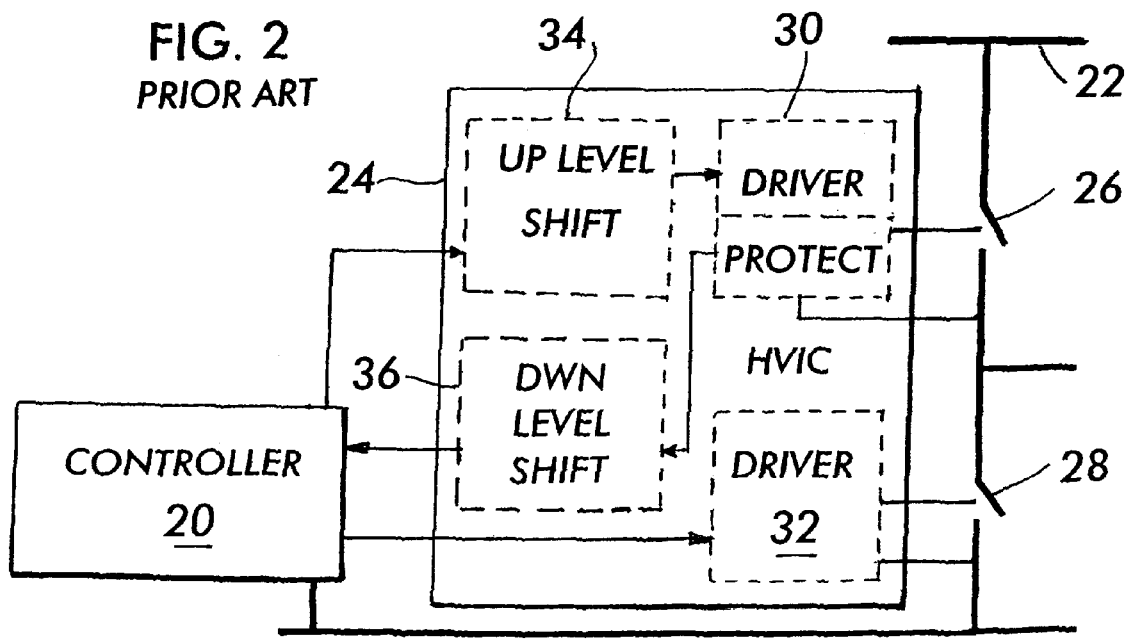
FIG. 2 is a block diagram illustrating a prior art circuit for communicating between a controller and a fault protection circuit in a high side driver using level shift down circuitry.
Figure 3:
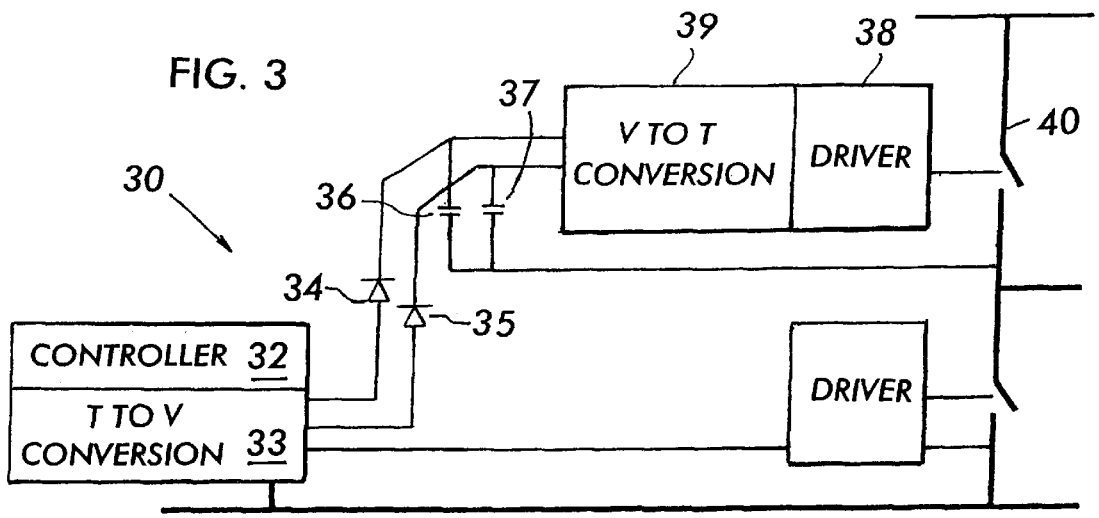
FIG. 3 is a block diagram illustrating an analog circuit according to the present invention for communicating between a controller and a high side driver.

Referring to FIG. 3, a block diagram of a controller circuit 30 according to the present invention is shown. A controller 32 includes time to voltage coding circuitry 33 which generates one or more voltages available at its outputs. The voltages are supplied through high voltage diodes 34 and 35 to capacitors 36 and 37, or a voltage storing network (such as through a sample and hold) that are referenced to a driver 38. The driver 38 generates an "ON time" and an "OFF time" on each cycle. Decoding circuitry 39 in the driver decodes these voltages on the capacitors to create the correct corresponding ON and OFF time pulses, thus controlling high side switch 40.

As the controller changes the required pattern (on and off times) of pulses based on external events and final results of the system (such as is done in a typical feedback control method of operation), the required pattern is converted and coded into voltages by coder 33.

During operation, at every pulse the high side switch 40 is turned off and the bottom diode 35 turns on and brings the decoder 39 and high side driver's 38 reference point down to near the ground of the controller. The high voltage diode 34 becomes forward biased and transfers the information (coded voltages) from coder 33 to the input of the decoder 39 which then sets the times for the next pulse. This process is repeated every cycle. To improve noise immunity, the controller can alternatively provide currents which then get converted to the appropriate coded parameter.

Figure 4:
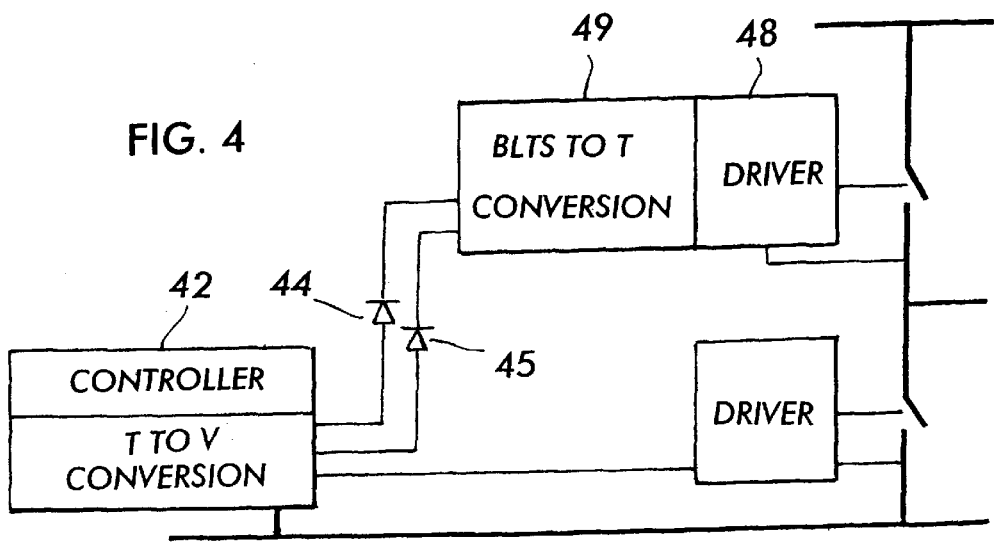
FIG. 4 is a block diagram illustrating a digital circuit according to the present invention for communicating between a controller and a high side driver.

Referring to FIG. 4, information exchange according to the present invention can be done in a purely digital fashion using circuit 40. The controller 40 has one or more lines as output which are connected through high voltage diodes 44 and 45 to the driver 48. When the driver is at ground level, the controller can output a coded string of bits into registers inside the driver which then get decoded by decoder 49 to the timing information.

Figure 5:
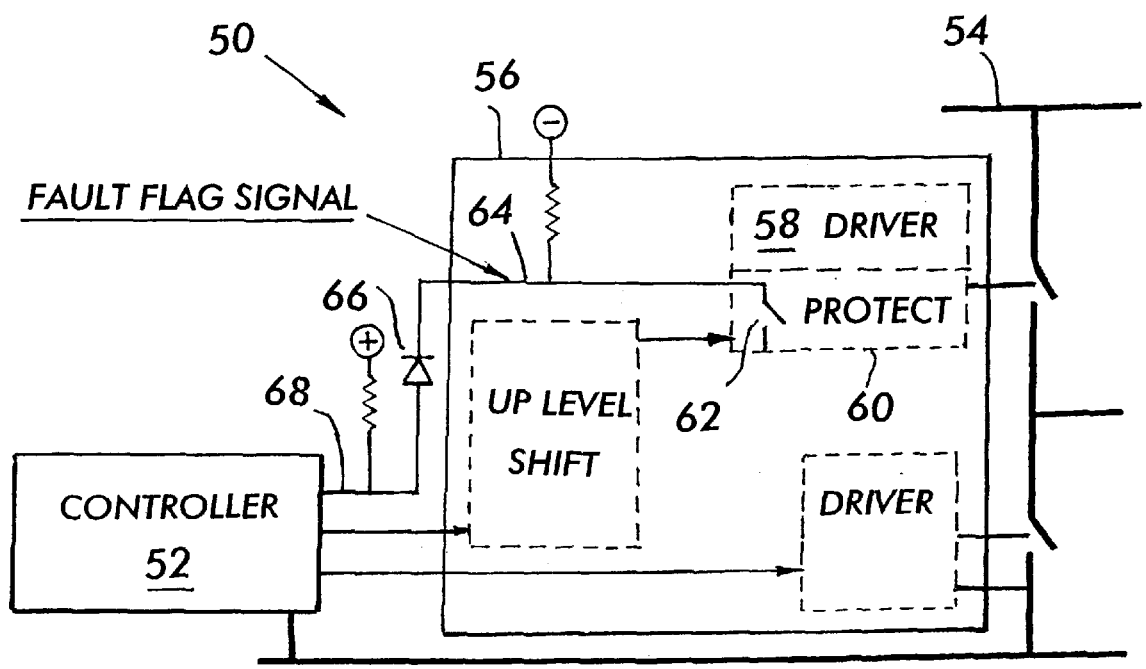
FIG. 5 is a block diagram illustrating an analog circuit according to the present invention for communicating between a controller and a fault protection circuit of a high side driver.

Referring to FIG. 5, a method of communicating fault detection according to the present invention is shown in the block diagram of circuit 50. In this example, a controller 52 communicates with a switching circuit 54 by way of a driver circuit 56. A high side driver 58 includes fault protection circuitry 60. When a fault is detected, switch 62 that sets the voltage of fault flag signal node 64 is turned off. Alternatively, the switch can be configured as a normally low signal that turns high when a fault is detected. When the switch 62 turns off, the controller output state goes to ground as the bottom freewheeling diode (not shown) turns on.

The fault flag node is sensed through a high voltage diode 66 as shown in FIG. 5. In normal conditions, the anode and the cathode of the diode are high, but in a fault situation the diode is forward biased, which causes the controller input 68 to go low. This condition tells the controller 52 that there is a fault situation in the high side device, and the controller can take the required action.

It is possible to use more than one such flag which can communicate to the controller the particular condition of the device, such as over current, short circuit, etc.

Of course, the circuits of FIGS. 3 and 5 could be combined to provide an analog circuit with driver protection requiring no level shift up. In addition, the circuit of FIG. 5 could be provided in a digital form similar to that of FIG. 4, and could be combined with the circuit of FIG. 4 to provide a digital solution that requires no level shift circuitry.

Although the present invention has been described in relation to particular embodiments thereof, many other variations and modifications and other uses will become apparent to those skilled in the art. Therefore, the present invention is to be limited not by the specific disclosure herein, but only by the appended claims.

What is claimed is:

1. A circuit comprising:
   a high voltage switch being operable at an operating voltage;
   a driver for controlling the high voltage switch;
   a low voltage controller, said low voltage controller being operable at a voltage below the operating voltage of the high voltage switch; and
   means for communicating between the controller and the driver without using a level shift circuit.

2. The circuit of claim 1, wherein the low voltage controller includes coding circuitry generating an output, the driver includes decoding circuitry, and the means for communicating between the controller and the driver comprises means for transmitting the output to the driver, the driver decoding the output to generate on and off time pulses for controlling the switch.

3. A circuit comprising:
   a low voltage controller;
   a driver for controlling a high voltage switch, the low voltage controller operating at a voltage below an operating voltage of the high voltage switch;
   means for communicating between the controller and the driver without using a level shift circuit; and
   wherein the low voltage controller includes coding circuitry generating an output, the driver includes decoding circuitry, and the means for communicating between the controller and the driver comprises means for transmitting the output to the driver, the driver decoding the output to generate on and off time pulses for controlling the switch;
   wherein the means for communicating between the controller and the driver comprises a voltage transmitting circuit including one or more diodes connected between the controller and the driver, with the one or more diodes being connected using an anode to the controller and a cathode to the driver.

4. The circuit of claim 3, further comprising a capacitor connected between a high side of each diode and a low side of the high voltage switch.

5. The circuit of claim 3, wherein the means for communicating between the controller and the driver comprises a voltage storing network.

6. The circuit of claim 3, wherein the coding circuitry comprises a time-to-voltage converter.

7. The circuit of claim 3, wherein the coding circuitry comprises a time-to-bits converter.

8. The circuit of claim 3, wherein the driver further comprises fault protection circuitry, and the means for communicating further comprises means for transmitting a fault signal to the controller.

9. The circuit of claim 8, wherein the means for transmitting a fault signal to the controller comprises a diode.

10. A circuit comprising:
    a high voltage switch being operable at an operating voltage;
    a driver for controlling the high voltage switch;
    a low voltage controller, said low voltage controller being operable at a voltage below the operating voltage of the high voltage switch; and
    means for communicating coded and decoded outputs between the controller and the driver without using a level shift circuit.

11. A circuit comprising:
    a low voltage controller;
    a driver for controlling a high voltage switch, the low voltage controller operating at a voltage below an operating voltage of the high voltage switch; and
    means for communicating between the controller and the driver without using a level shift circuit;
    the means for communicating receiving a low voltage signal from the controller and providing said low voltage signal to the driver for controlling the operation of said high voltage switch.

12. The circuit of claim 11, wherein the means for communicating comprises at least one diode connected between the controller and the driver with the at least one diode being polarized such that the anode is coupled to the controller and the cathode is coupled to the driver.

13. The circuit of claim 12, further comprising a storage capacitor coupled to the cathode of the at least one diode.

* * * * *